US007767129B2

(12) United States Patent
Sandhu et al.

(10) Patent No.: US 7,767,129 B2

(45) Date of Patent: Aug. 3, 2010

(54) IMPRINT TEMPLATES FOR IMPRINT LITHOGRAPHY, AND METHODS OF PATTERNING A PLURALITY OF SUBSTRATES

(75) Inventors: Gurtej S. Sandhu, Boise, ID (US); Randal W. Chance, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1368 days.

(21) Appl. No.: 11/127,942

(22) Filed: May 11, 2005

(65) Prior Publication Data

US 2006/0255505 A1 Nov. 16, 2006

(51) Int. Cl.

*B24B 33/055* (2006.01)
*B29C 59/00* (2006.01)
*H01L 27/00* (2006.01)

(52) U.S. Cl. ........................ 264/293; 264/162; 977/887

(58) Field of Classification Search ................ 264/293, 264/320, 162; 977/887
See application file for complete search history.

(56) References Cited

U.S. PATENT DOCUMENTS 2,118,801 A * 5/1938 Bansett .................... 101/401.3
5,252,360 A * 10/1993 Huttl et al. ............. 427/249.17
5,855,974 A * 1/1999 Wu et al. .................... 427/560
6,309,580 B1 * 10/2001 Chou ......................... 264/338
6,482,742 B1 11/2002 Chou
6,680,214 B1 * 1/2004 Tavkhelidze et al. .......... 438/20
6,696,220 B2 2/2004 Bailey et al.
6,719,915 B2 4/2004 Wilson et al.
6,753,130 B1 6/2004 Liu et al.
6,805,054 B1 10/2004 Meissl et al.
6,814,898 B1 11/2004 Deeman et al.
6,842,229 B2 1/2005 Sreenivasan et al.
2003/0127580 A1 7/2003 Ling et al.
2004/0021254 A1 2/2004 Sreenivasan et al.
2004/0079278 A1 * 4/2004 Kamins et al. ................ 117/84
2004/0188381 A1 9/2004 Sreenivasan
2004/0224261 A1 11/2004 Resnick et al.

OTHER PUBLICATIONS

W. J. Dauksher et al., *Step and flash imprint lithography template characterization from an etch perspective*, J. Vac. Sci Technol. B 21(6), pp. 2771-2776 (Nov./Dec. 2003).
T. C. Bailey et al., *Recent Advances in Step and Flash Imprint Lithography*, Interface, pp. 1-20 (2002).
T. C. Bailey et al., *Template fabrication schemes for step and flash imprint lithography*, Microelectronic Engineering 61-62, pp. 461-467 (2002).

* cited by examiner

*Primary Examiner*—Matthew J. Daniels
(74) *Attorney, Agent, or Firm*—Wells St. John P.S.

(57) ABSTRACT

The invention comprises methods of patterning a plurality of substrates, and imprint templates used in imprint lithography. In one implementation, a method of patterning a plurality of substrates includes providing an imprint template having a plurality of spaced features. A first substrate is imprinted with the imprint template effective to form a plurality of recesses into the first substrate from the spaced features. After imprinting the first substrate, an elevationally outermost portion of the spaced features is removed effective to reduce elevation of the spaced features. After the removing, a second substrate is imprinted with the imprint template using the elevation-reduced spaced features effective to form a plurality of recesses into the second substrate from the elevation-reduced spaced features. Other aspects and implementations are contemplated.

23 Claims, 15 Drawing Sheets

70a
72
74a
72
72
74a
74a
74a
71a
71a
71a
71a

IMPRINT TEMPLATES FOR IMPRINT LITHOGRAPHY, AND METHODS OF PATTERNING A PLURALITY OF SUBSTRATES

TECHNICAL FIELD

This invention relates to methods of patterning a plurality of substrates, and to imprint templates used in imprint lithography.

BACKGROUND OF THE INVENTION

Integrated circuits are typically fabricated onto and within semiconductor substrates, with the continuing trend being towards ever-smaller devices and circuitry. The key to this progress has been microlithography which has been used to create micron- and submicron-scale structures for fabricating various devices of the integrated circuits. For decades, microlithography has been dominated by the use of light and photosensitive material to etch or otherwise pattern structures and regions relative to an underlying semiconductor substrate. Such is commonly referred to as photolithography, whereby the details of a particular circuit layer can be projected from a photomask onto photosensitive material on the substrate. The use of progressively shorter wavelengths of the incident radiation, along with increased complexity in the photomasks, has continually led to a reduction of the minimum feature size of the circuit devices using photolithography.

Present generation photolithography typically operates at a wavelength of 193 nanometers, which is about 8 millionths of an inch. Such can enable the patterning of structures on a substrate having a half-pitch as low as 90 nanometers. Considerably shorter nanometer wavelength light is being investigated, and coupled with other masking and projecting techniques, is expected to enable at least sub-70 nanometer photolithography. However, it remains to be seen whether the equipment enabling such photolithography will be cost prohibitive. Accordingly, needs remain in microlithography for producing ever smaller and denser integrated circuit devices.

One such potential solution is known as imprint lithography. Essentially, such is a micromolding process in which the topography of a template, or mold, defines the patterns to be created on a substrate resulting from physical contact of the template with the substrate. Typically, the template is pressed into a thin film formed onto the substrate, deforming the shape of the film according to the features of the template and forming a relief pattern in the film. The imprinted film might be further processed by projecting radiation through the mold into the film to solidify the film, followed by mold removal. Alternately, by way of example only in thermal imprint photolithography, suitable solidification of the imprinted film might occur by temperature reduction after the imprinting. Regardless, typically thereafter, the thin film is suitably processed to remove the reduced thickness portions, thereby forming a hard mask which can be utilized for etching or as an implant mask, by way of example only, relative to underlying material. The imprint templates are typically used hundreds or thousands of times in processing other substrates before defects start to occur from wear.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of patterning a plurality of substrates, and comprises imprint templates used in imprint lithography. In one implementation, a method of patterning a plurality of substrates includes providing an imprint template having a plurality of spaced features. A first substrate is imprinted with the imprint template effective to form a plurality of recesses into the first substrate from the spaced features. After imprinting the first substrate, an elevationally outermost portion of the spaced features is removed effective to reduce elevation of the spaced features. After the removing, a second substrate is imprinted with the imprint template using the elevation-reduced spaced features effective to form a plurality of recesses into the second substrate from the elevation-reduced spaced features.

In one implementation, an imprint lithography imprint template comprises a base substrate. A plurality of spaced features projects from the base substrate. The spaced features comprise different first and second materials. The second material is received elevationally outward of the first material and is harder than the first material.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
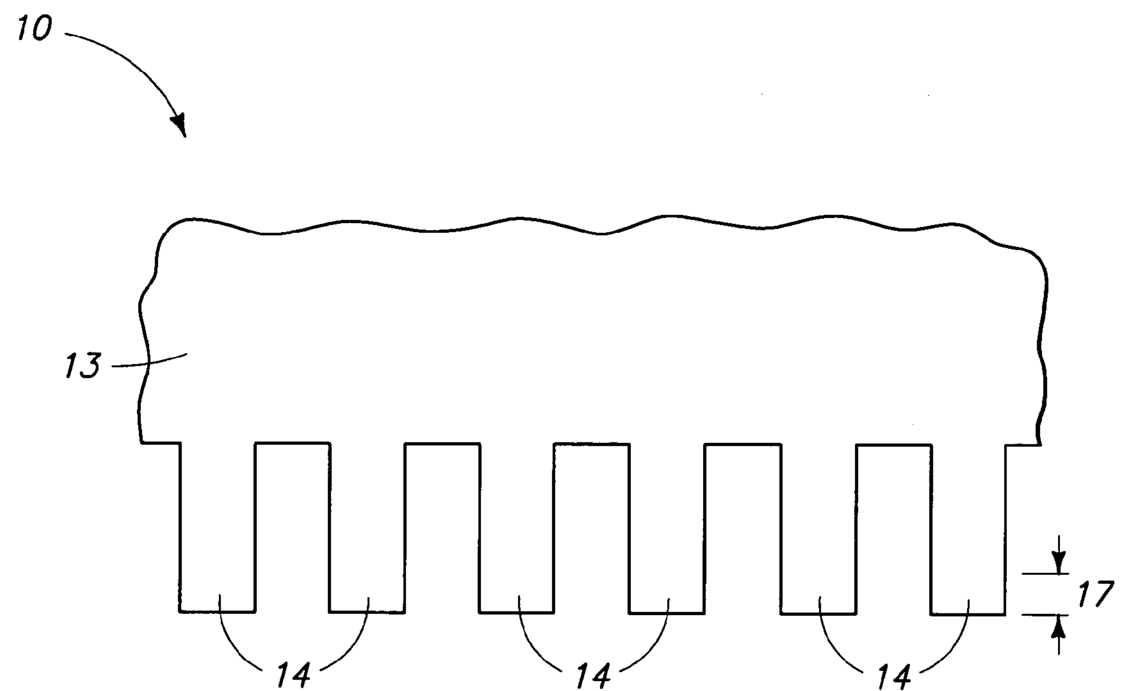
FIG. 1 is a diagrammatic representation of an imprint template and a substrate to be imprinted upon in accordance with an aspect of the invention.
Figure 1:
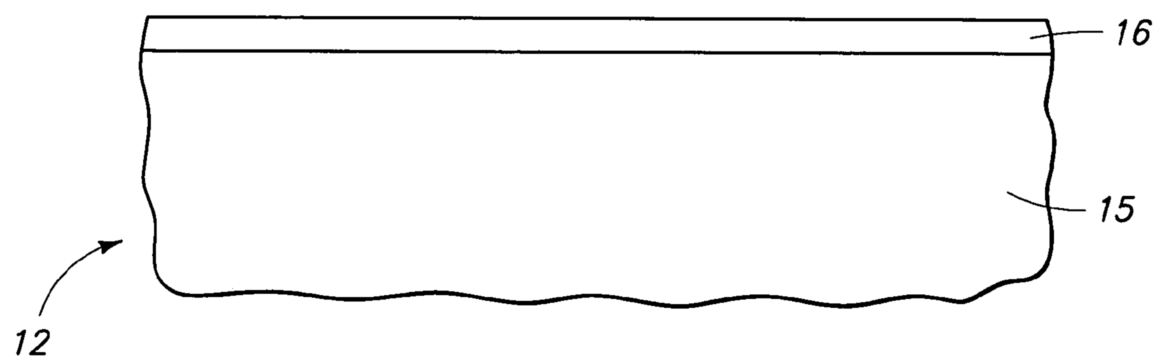

An exemplary method of patterning a plurality of substrates is described initially with reference to FIGS. 1-6. FIG. 1 depicts an imprint template 10 and a first substrate 12 which will be imprinted upon. In the context of this document, an "imprint template" is any template used for conducting an imprinting operation wherein a plurality of recesses is formed into a substrate by the physical imprinting engagement of the template with another substrate. Exemplary imprint template 10 is comprised of a material 13, and has a plurality of spaced features 14 provided therein. By way of example only, such are depicted in the FIG. 1 embodiment as comprising identically shaped and dimensioned structures, although such is of course not required. Further by way of example only, particularly where fabricating semiconductor substrates to form integrated circuits, an exemplary width range for features 14 is anywhere from 0.1 nanometers to 5,000 microns, and more preferably in the range of from 0.1 nanometer to 10 nanometers. Such exemplary preferred ranges also typically define a preferred separation distance of the same values between adjacent features 14. Further by way of example only, preferred aspect ratios of individual features (defined as elevation of an individual feature divided by the width of an individual feature) is preferably from about 3 to 50, and more preferably from about 3 to 10. Spaced features 14 can be considered as comprising some elevationally outermost portion 17.

Exemplary first substrate 12 could by any substrate upon which imprint lithography will be conducted. An exemplary preferred substrate is a semiconductor substrate, with the method of patterning as described herein comprising the ultimate forming of one or more integrated circuits on substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

By way of example only, substrate 12 is depicted as comprising a base substrate 15 which might comprise one or multiple materials, with monocrystalline silicon being but one example. Alternate examples include plastic, glass and ceramic materials. A layer 16 has been deposited upon substrate material(s) 15. By way of example only, layer 16 might be any polymer that can be made pliable to pressure and can retain a pressure-imprinted deformation or pattern. Such might be a thermoplastic polymer, such as polycarbonate or polymethylmethacrylate, which temporarily softens in response to heat. Alternately by way of example only, it can be a liquid or semisolid, such as a UV-curable silicone which hardens in response to radiation, or for example a liquid which cures upon the application of heat. Such might also, of course, be a composite layer of polymer and hardenable liquid, or composites of other materials.

By way of example only, an exemplary thickness for layer 16 is from 1 Angstrom to 1,000 Angstroms, with a thickness range from 1 Angstrom to 100 Angstroms being more preferred. Further preferably, spaced features 14 on imprint template 10, at least prior to conducting an imprint operation on substrate 12, comprise respective elevations from base substrate material 13 which are at least three times the thickness of layer 16, more preferably at least five times the thickness of layer 16, and even more preferably at least ten times the thickness of layer 16. An exemplary preferred base material 13 for imprint template 10 comprises quartz, which is transmissive to incident radiation where such will be utilized for curing or otherwise solidifying layer 16 after/during an imprint operation. Imprint template 10 might of course comprise a number of different materials and layers.

FIG. 1 depicts imprint template 10 being received elevationally over first substrate 12. Of course, any other orientation of a template and substrate relative to one another might be utilized in conducting exemplary imprint operations as described subsequently. Further and regardless, the described imprinting may or may not include one or more separate layers 16 formed over an underlying substrate.

Figure 2:
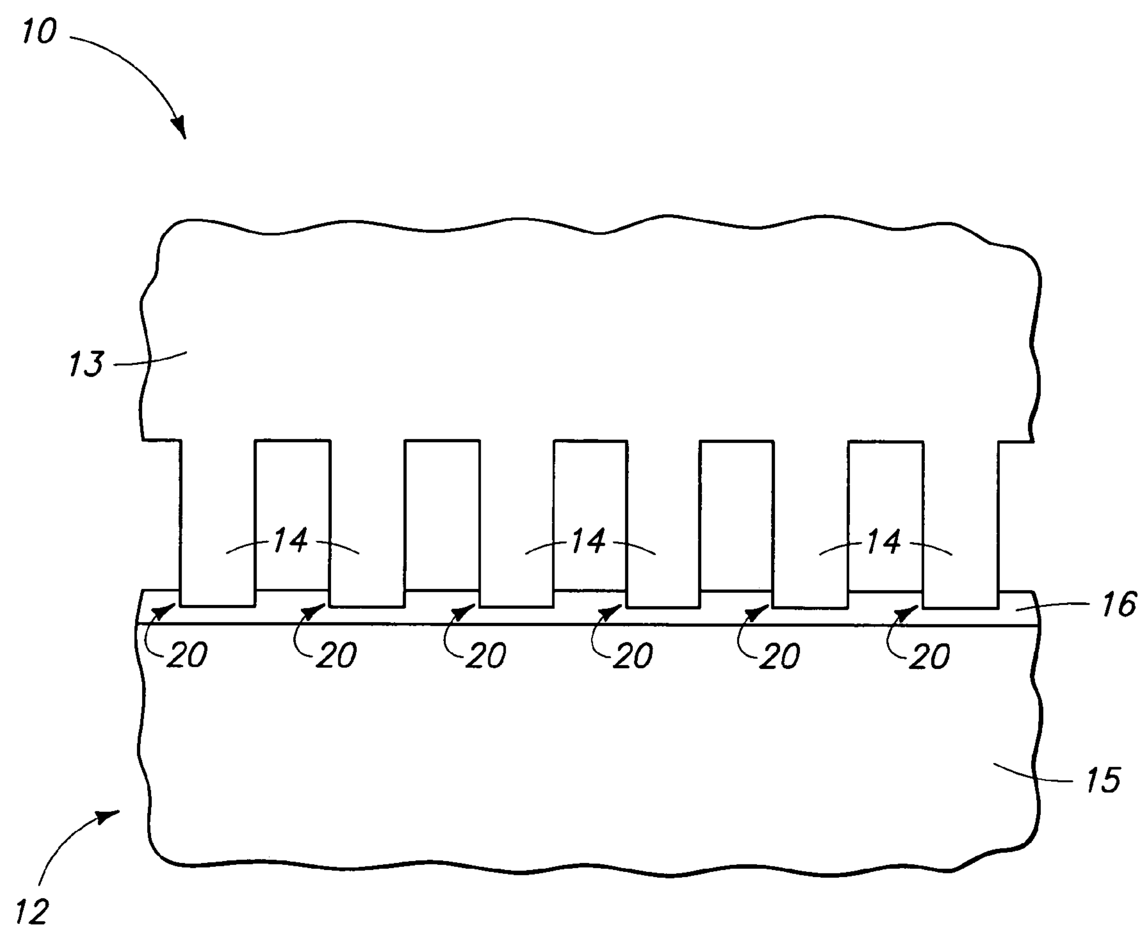
FIG. 2 is a view of the imprint template and substrate of FIG. 1 at a processing step subsequent to that shown by FIG. 1.

Referring to FIG. 2, first substrate 12 has been imprinted with imprint template 10 effective to form a plurality of recesses 20 into first substrate 10 from spaced features 14. FIG. 2 depicts recesses 20 being formed only partially within the preferred embodiment-layer 16, although of course, forming recesses 20 to extend completely through layer 16 to underlying material 15 is also contemplated. Processing might preferably occur relative to the FIG. 2 configuration whereby, after the initial recessing, layer 16 is processed to solidify/harden the same (assuming such is not at a desired resultant hardness already), for example by passing radiation thereto through imprint template 16, by cooling layer 16, by heating layer 16, or any other existing or yet-to-be developed technique depending on the composition/presence of layer 16.

Figure 3:
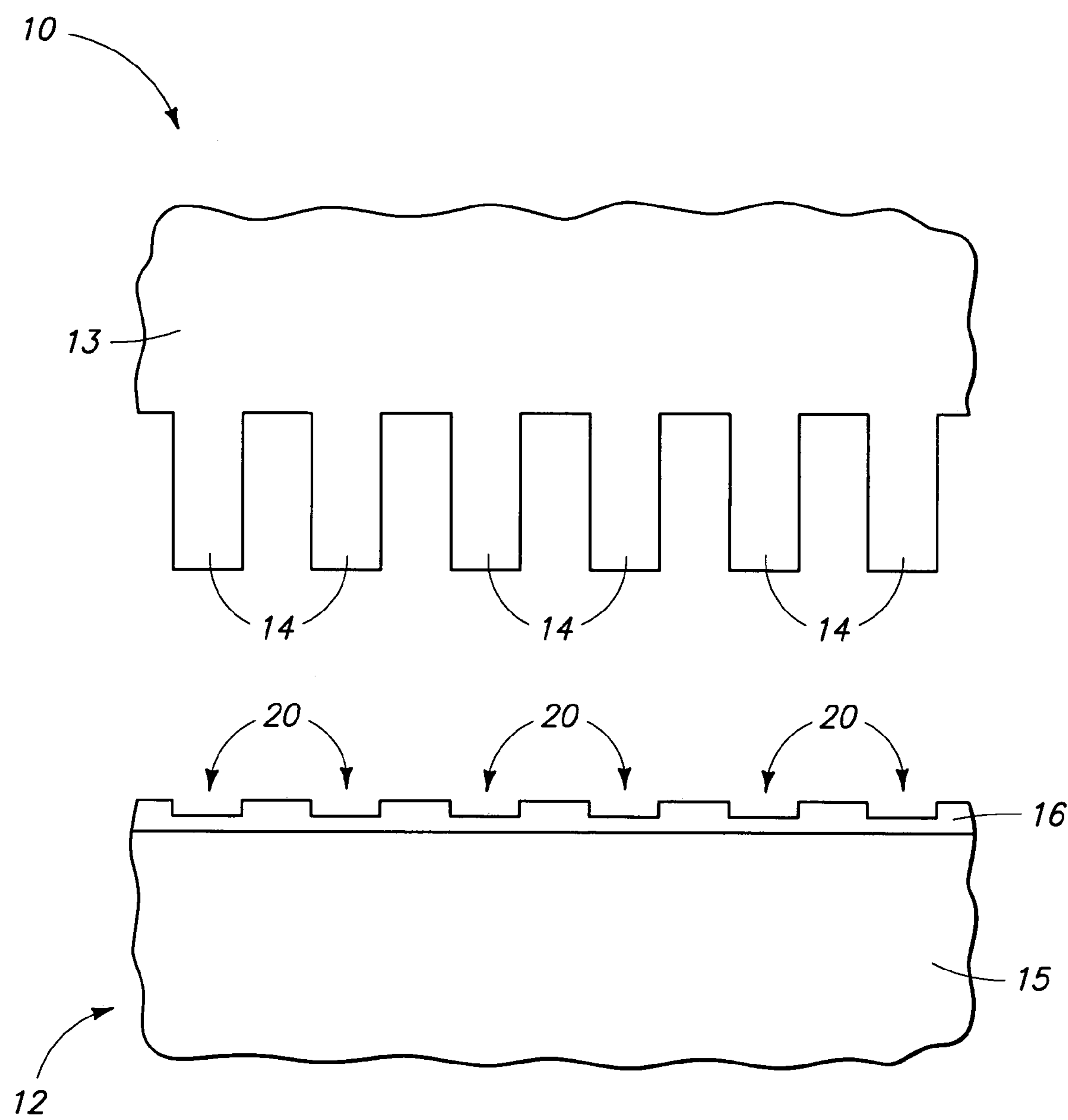
FIG. 3 is a view of the imprint template and substrate of FIG. 2 at a processing step subsequent to that shown by FIG. 2.

FIG. 3 depicts displacement of imprint template 10 from first substrate 12.

Figure 4:
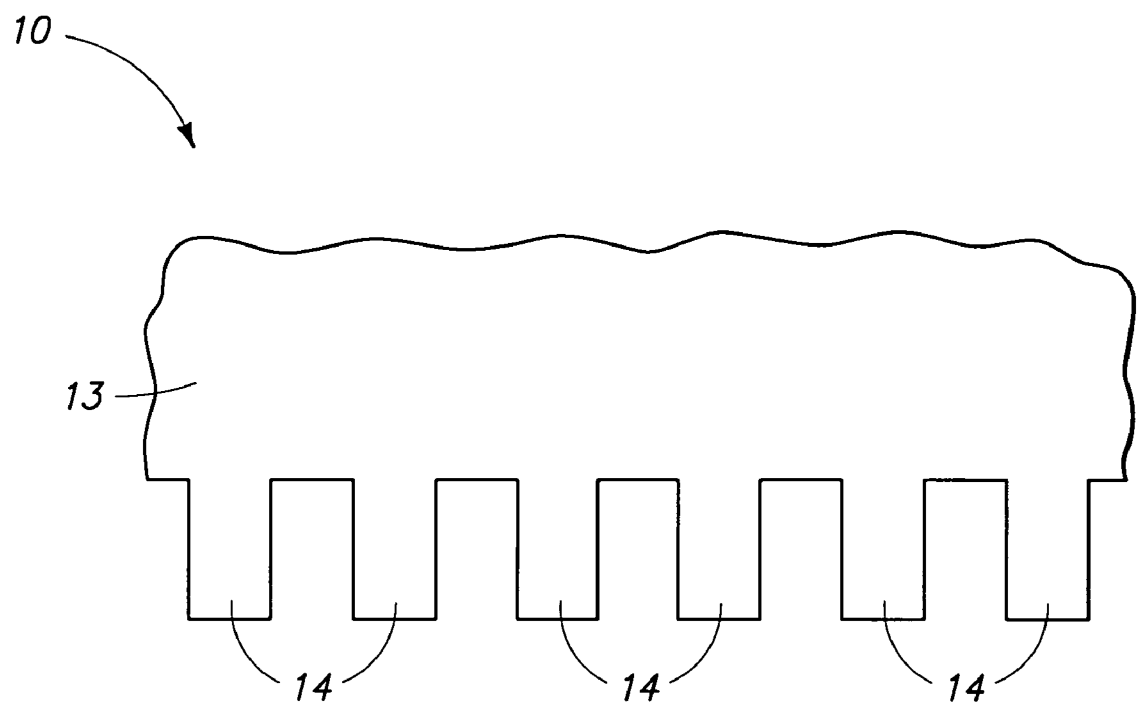
FIG. 4 is a view of the imprint template of FIG. 3 at a processing step subsequent to that shown by FIG. 3.

Referring to FIG. 4 and after imprinting the first substrate, elevationally outermost portions 17 (shown in FIG. 1, not shown in FIG. 4) of spaced features 14 have been removed effective to reduce the elevation of the spaced features from what such were, for example from that as depicted in FIG. 1. By way of example only, such removing might be by etching action, preferably anisotropic in the depicted example to avoid changes to feature width, or by polishing. Exemplary preferred polishing techniques include purely mechanical polishing, and alternately chemical mechanical polishing. Regardless and by way of example only, an exemplary amount of feature elevation removed is from 10 Angstroms to 1,000 Angstroms. Further by way of example only, and not by way of limitation, a possible reason for removing an elevationally outermost portion of the spaced features would be to remove contaminants or impurities which might result after processing one or a plurality of substrate, and/or perhaps to remove worn and/or damaged portions of feature 14 to thereby extend the life of the imprint template.

Figure 5:
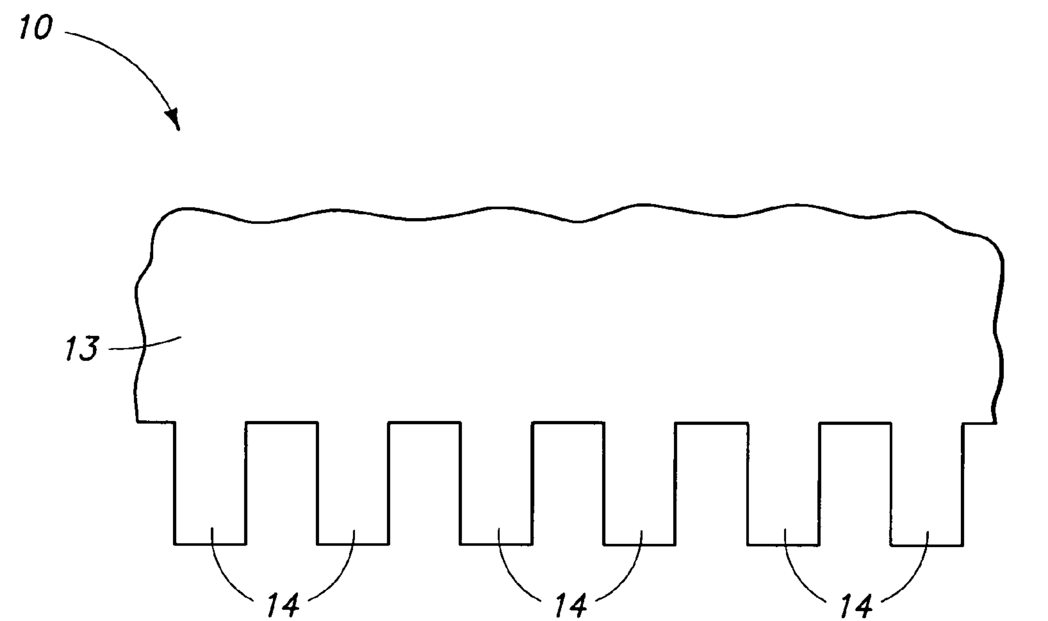
FIG. 5 is a view of the imprint template of FIG. 4 and a substrate at a processing step subsequent to that shown by FIG. 4.
Figure 5:
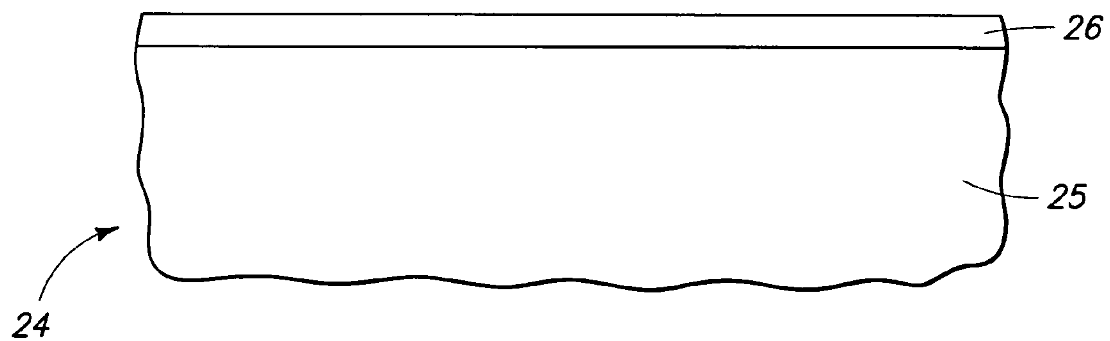

FIG. 5 depicts positioning imprint template 10 having elevation-reduced spaced features 14 proximate a second substrate 24, which might be the same as substrate 12 or be a different substrate. Substrate 24 is depicted as comprising an exemplary base substrate 25 having an overlying layer 26 formed thereon.

Figure 6:
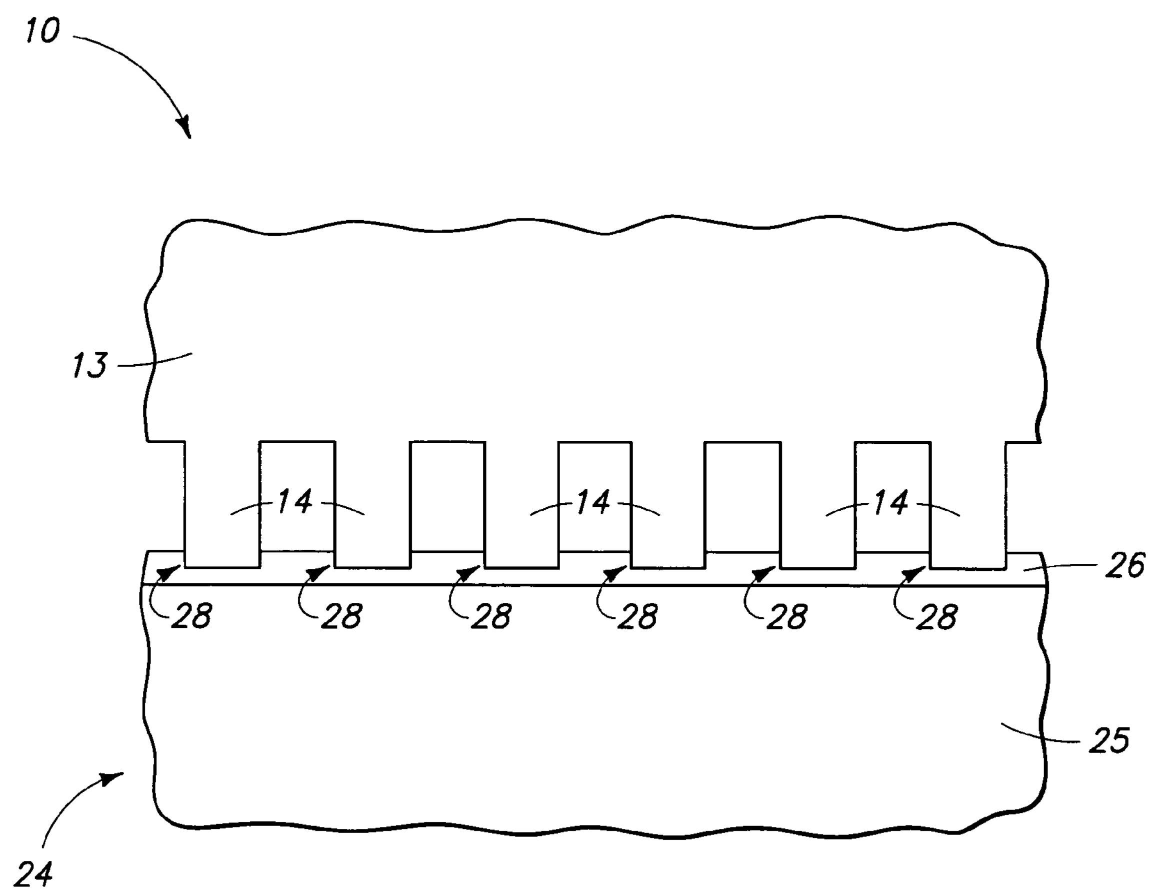
FIG. 6 is a view of the imprint template and substrate of FIG. 5 at a processing step subsequent to that shown by FIG. 5.

FIG. 6 depicts imprinting second substrate 24 with imprint template 10 using elevation-reduced spaced features 14 effective to form a plurality of recesses 28 into second substrate 24 from elevation-reduced spaced features 14.

Figure 7:
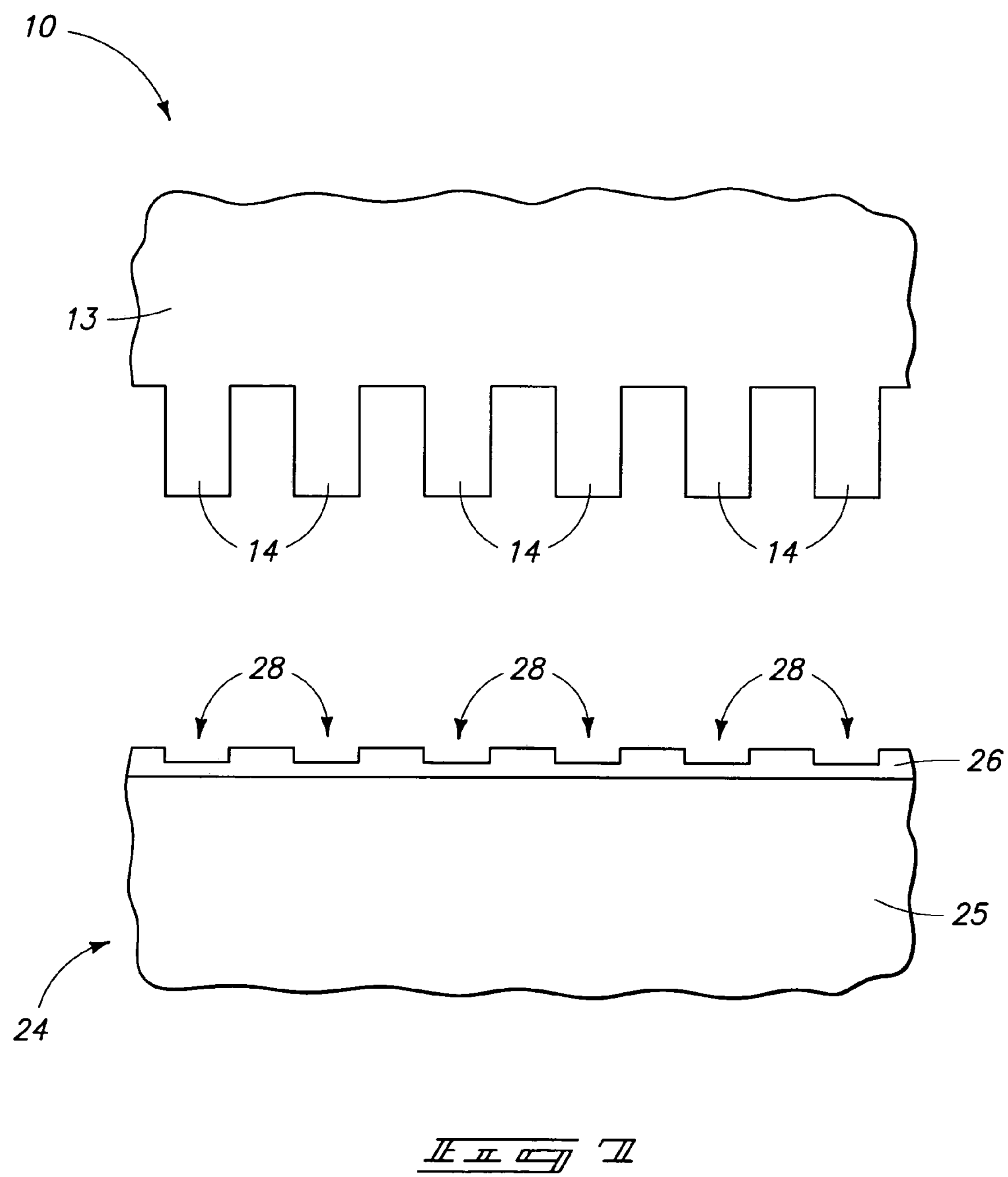
FIG. 7 is a view of the imprint template and substrate of FIG. 6 at a processing step subsequent to that shown by FIG. 6.

FIG. 7 depicts the displacement of imprint template 10 from second substrate 24.

Figure 8:
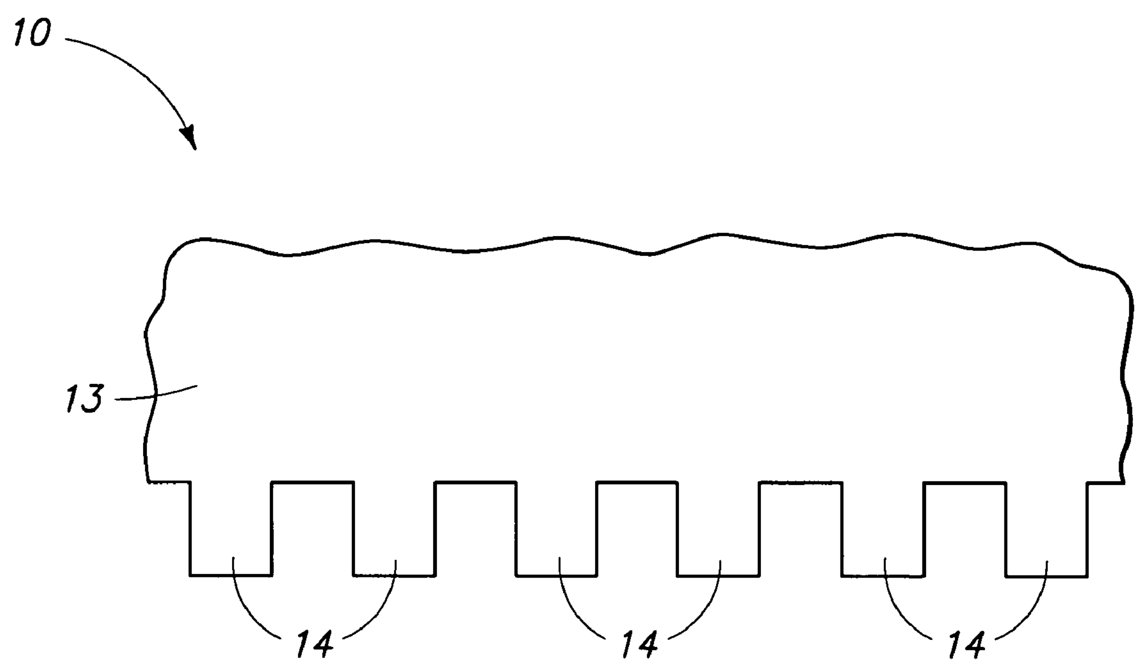
FIG. 8 is a view of the imprint template of FIG. 7 at a processing step subsequent to that shown by FIG. 7.

FIG. 8 depicts additional preferred processing whereby after imprinting second substrate 24, another elevationally outermost portion of spaced features 14 has been removed effective to further reduce the elevation of spaced features 14.

Figure 9:
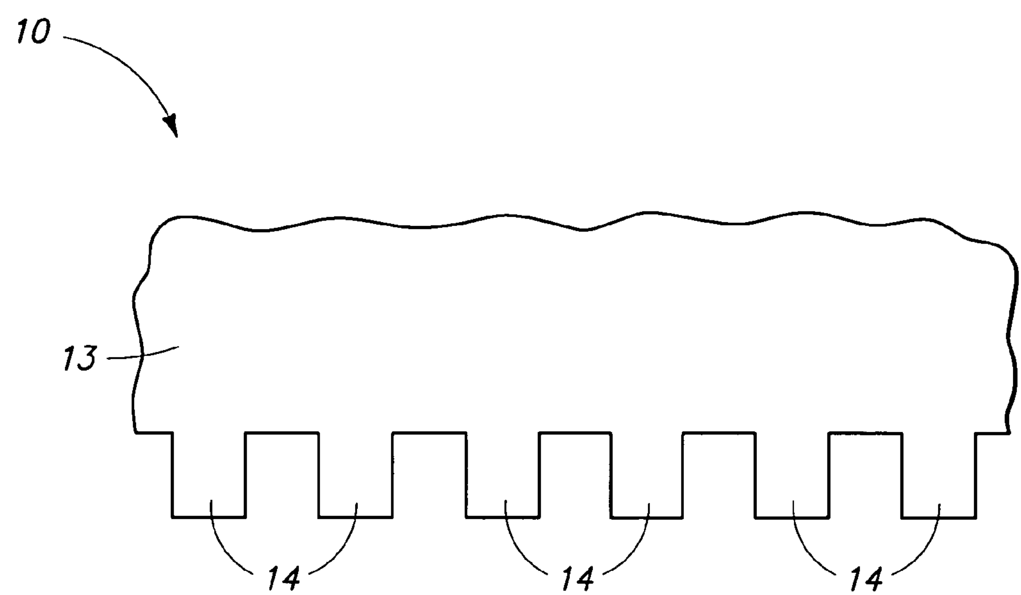
FIG. 9 is a view of the imprint template of FIG. 8 and a substrate at a processing step subsequent to that shown by FIG. 8.
Figure 9:
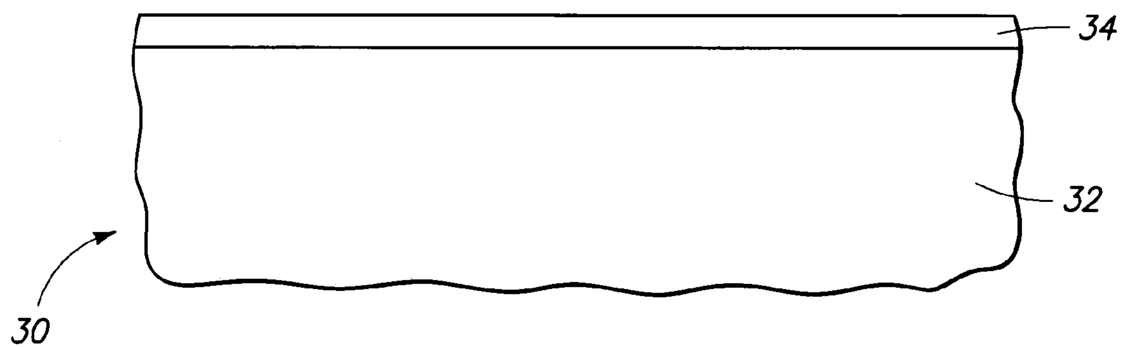

FIG. 9 depicts the positioning of the FIG. 8 imprint template 10 relative to a third substrate 30, which may be the same as one of the first and second substrates or may be an entirely different substrate processed the same or differently from other first and second substrates. Third substrate 30, by way of example only, is depicted as comprising a base substrate material 32 having an overlying layer 34 formed thereover.

Figure 10:
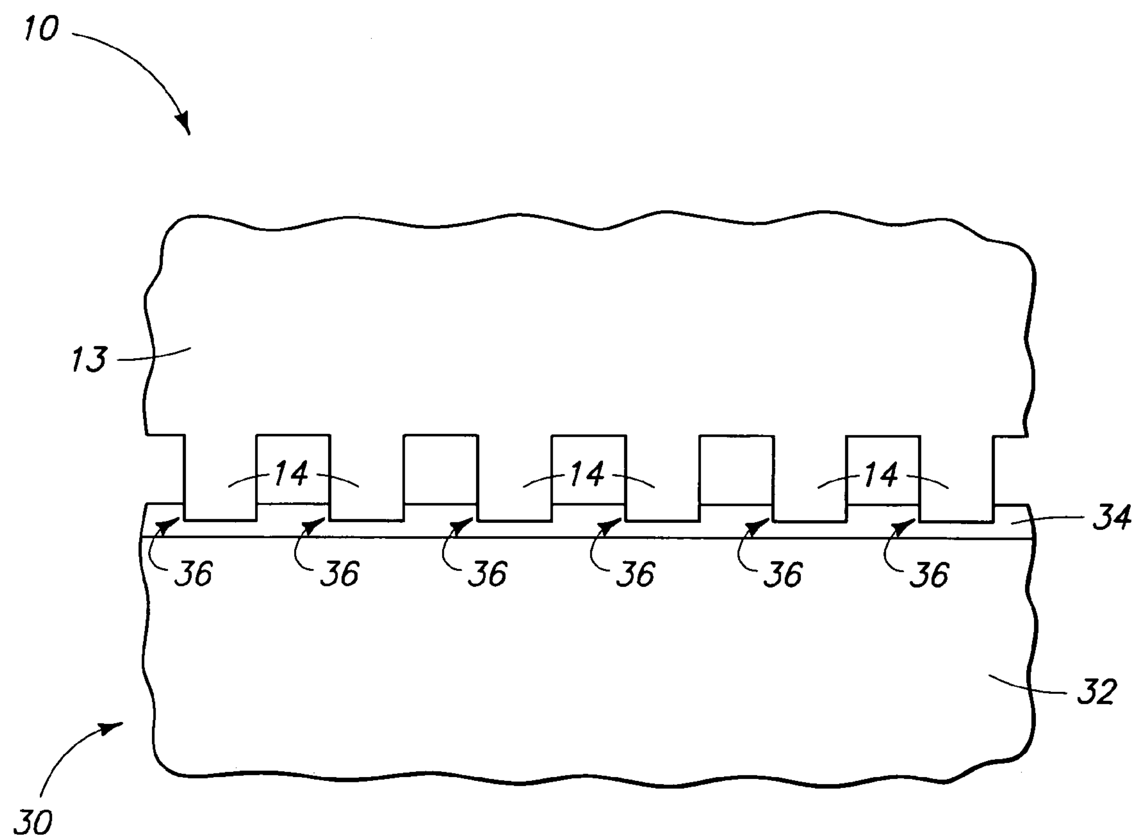
FIG. 10 is a view of the imprint template and substrate of FIG. 9 at a processing step subsequent to that shown by FIG. 9.

Referring to FIG. 10, third substrate 30 has been imprinted with imprint template 10 using the further elevation-reduced spaced features effective to form a plurality of recesses 36 into third substrate 30 from elevation-reduced spaced features 14.

Figure 11:
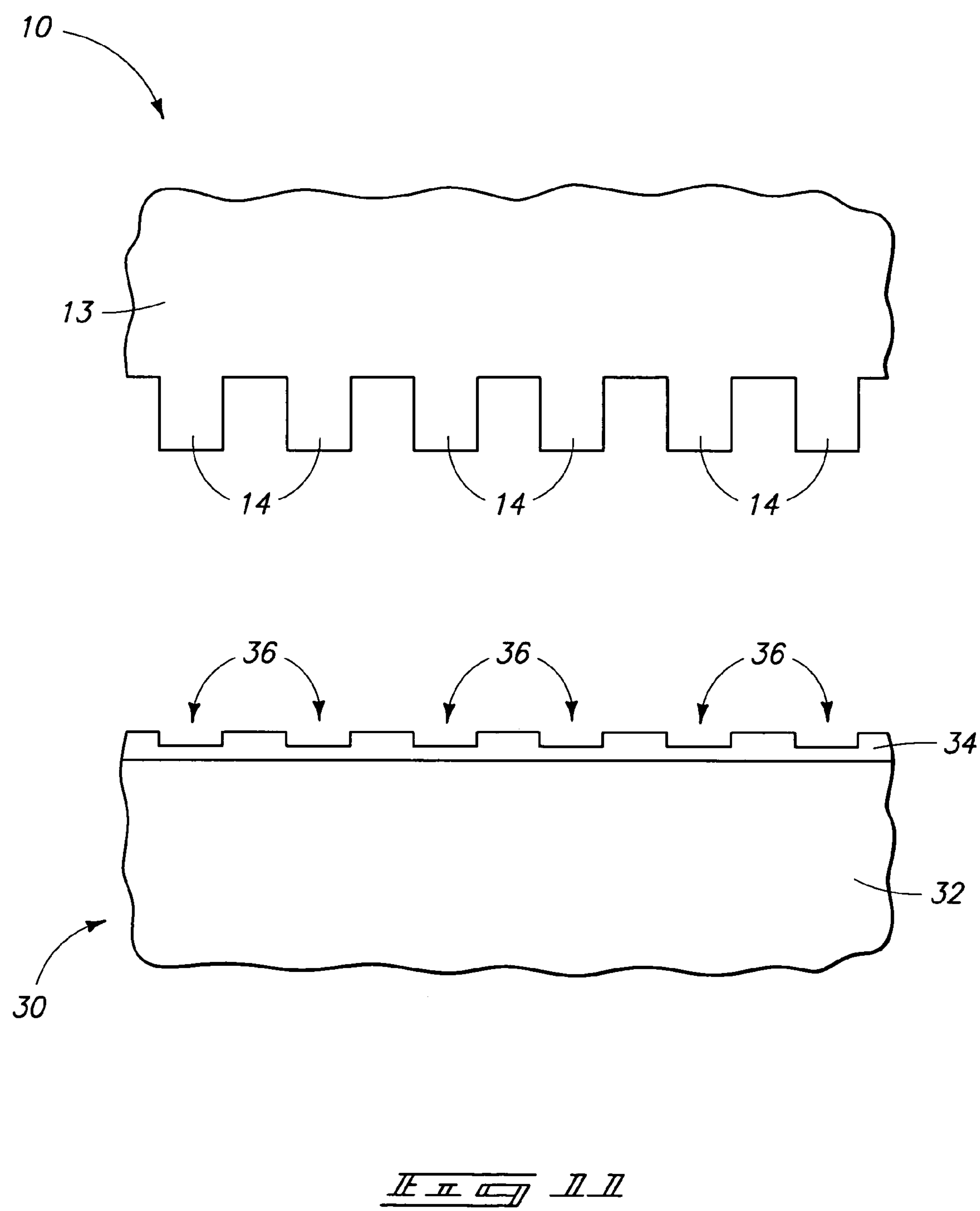
FIG. 11 is a view of the imprint template and substrate of FIG. 10 at a processing step subsequent to that shown by FIG. 10.

FIG. 11 depicts the displacement of imprint template 10 from third substrate 30.

The above exemplary processing was relative to imprinting a first substrate and a second substrate, and wherein such might be the same or different substrates. Further, reference to "first" and "second" only refer to imprinting relative to such substrates, not whether such are the first ever or second ever substrates imprinted in accordance with the method of patterning a plurality of substrates in accordance with aspects of the invention. Accordingly, substrates might be imprinted before the stated first substrate, and intermediate the first and second substrates, and regardless of whether the stated third substrate is imprinted.

Nevertheless, one aspect of an exemplary method of patterning a plurality of substrates in accordance with the invention includes imprinting a first series of substrates with an imprint template effective to form a plurality of recesses into the first series of substrates from the spaced features. After imprinting the first series of substrates, an elevationally outermost portion of the spaced features is removed effective to reduce the elevation of the spaced features. After such removing, a second series of substrates is imprinted with the imprint template using the elevation-reduced spaced features effective to form a plurality of recesses into the second series of substrates from the elevation-reduced spaced features. The first and second series of substrates might be the same or different substrates, and might include overlapping substrates common to the first and second series. Further of course, the number of substrates in the respective first and second series of substrates might be as few as two, or by way of example only, number in the hundreds or thousands. Further of course, such a method contemplates imprinting a series of third substrates with the imprint template. For example, such might include removing another elevationally outermost portion of the spaced features effective to further reduce the elevation of the spaced features after imprinting the second substrates.

Figure 12:
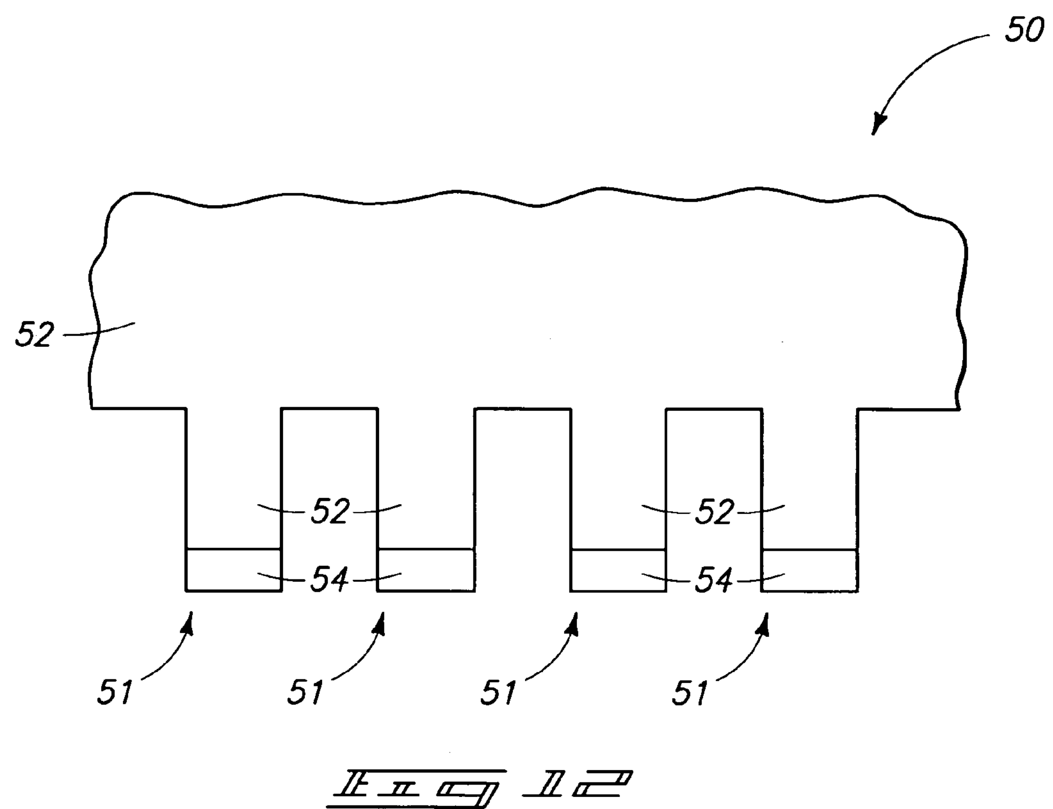
FIG. 12 is a diagrammatic representation of an imprint template in accordance with an aspect of the invention.

As stated above, imprint template 10 is but one exemplary template and such may comprise multiple materials and layers. FIG. 12 depicts an alternate exemplary imprint template usable in accordance with methodical aspects of the invention. Further, FIGS. 12-15 and FIGS. 17-19 depict exemplary imprint lithography imprint templates independent of inventive methods of use as herein described.

FIG. 12 depicts an exemplary imprint template 50 having a plurality of spaced features 51, and as could be usable in accordance with the above exemplary methods of patterning a plurality of substrates. Spaced features 51 comprise different first and second materials 52 and 54, respectively, at least prior to the first substrate imprinting. Second material 54 is received elevationally outward of first material 52, and is harder than the first material. In the context of this document, "elevationally outward" means in a direction of projection of the spaced features relative to underlying substrate material. Exemplary preferred harder materials 54, and for example where material 52 comprises quartz, include amorphous carbon, diamond, diamond-like carbon (DLC), carbides (i.e., TiC, SiC, BC) and nitrides (i.e., BN, $Si_3N_4$, TiN).

In accordance with apparatus or structural aspects of the invention, and independent of method, FIG. 12 can be considered as depicting an imprint lithography imprint template 50 comprising a base substrate 52. Base substrate 52 might comprise a plurality of different materials and/or layers, or may be homogeneous. Imprint template 50 includes a plurality of spaced features 51 projecting from base substrate 52. Spaced features 51 comprise different first and second materials 54, 52, respectively, with second material 54 being received elevationally outward of first material 52, and being harder than first material 52. Imprint template 50 depicts first material 52 and second material 54 being of different thicknesses within spaced features 51, with FIG. 12 depicting first material 52 being thicker than second material 54 within spaced features 51.

Figure 13:
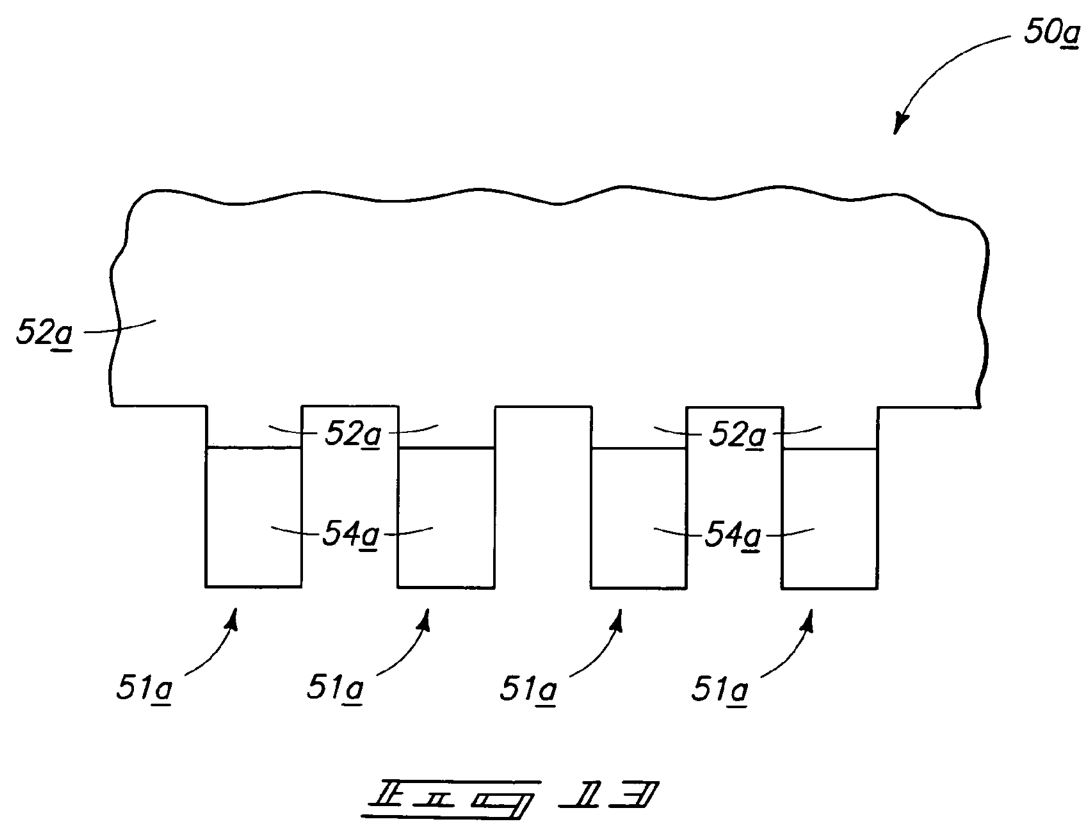
FIG. 13 is a diagrammatic representation of an imprint template in accordance with an aspect of the invention.

FIG. 13 depicts an alternate exemplary imprint template 50*a*. Like numerals from the FIG. 12 embodiment are utilized for common materials and preferred constructions, with differences being indicated with the suffix "a". Template 50*a* has second material 54*a* being thicker than first material 52*a* within spaced features 51*a*.

Figure 14:
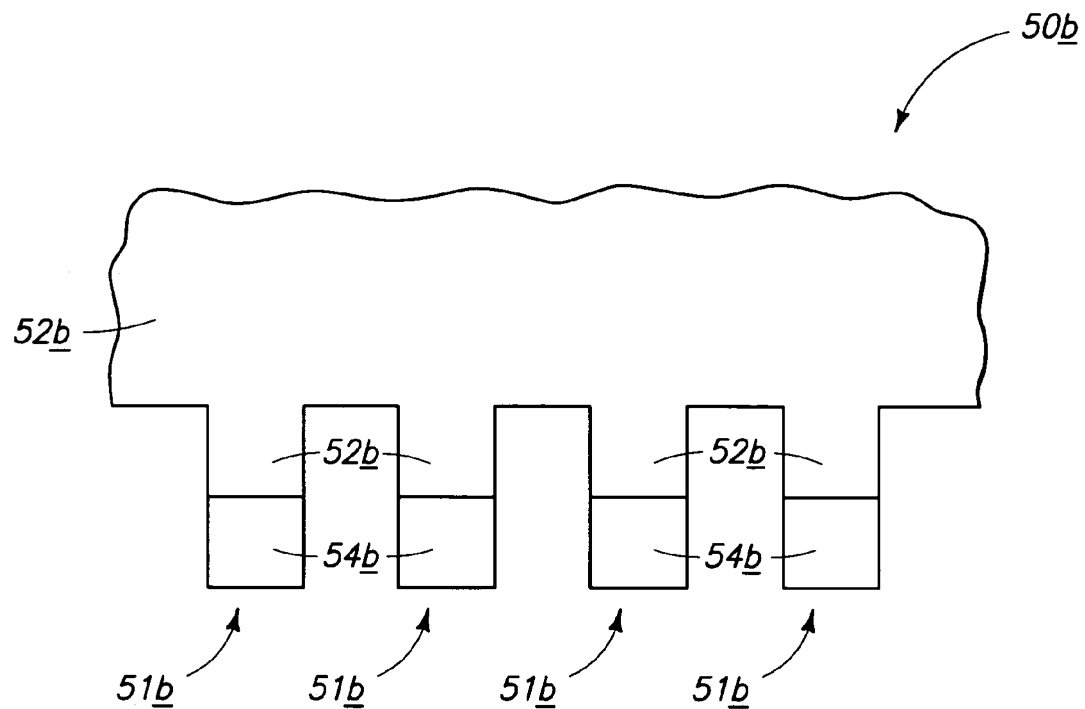
FIG. 14 is a diagrammatic representation of an imprint template in accordance with an aspect of the invention.

Further, the first and second materials might be of common thickness within the spaced features, for example as shown in FIG. 14 with respect to an alternate embodiment imprint template 50*b*. Like numerals have been utilized with respect to the FIG. 12 embodiment, with differences being indicated with the suffix "b".

Figure 15:
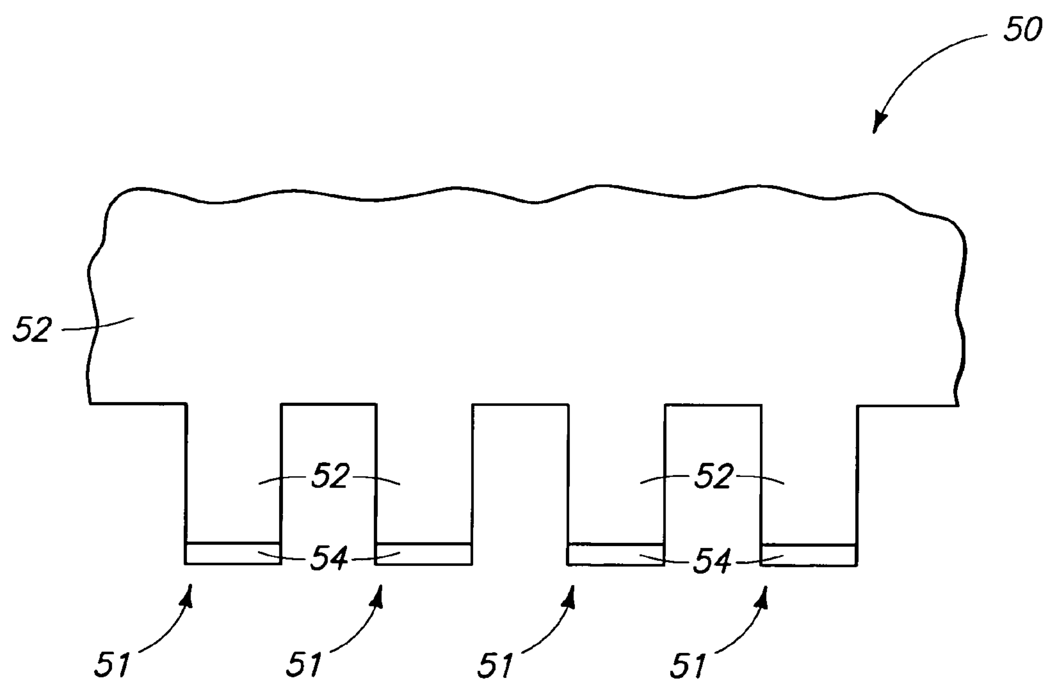
FIG. 15 is a diagrammatic representation of an imprint template in accordance with an aspect of the invention, and is a view of the FIG. 12 substrate at a processing subsequent to that exemplified by FIG. 12.

Referring to FIG. 15 and with respect to imprint template 50, such depicts an exemplary processing whereby after imprinting a first substrate, for example as described above, an elevationally outermost portion of spaced features 51 has been removed effective to reduce the elevation of spaced features 51. FIG. 15 depicts an embodiment whereby such removing is not to first material 52. Accordingly, subsequent imprinting of one or more substrates can be conducted utilizing the protective aspects of a harder outer protective material 54.

Figure 16:
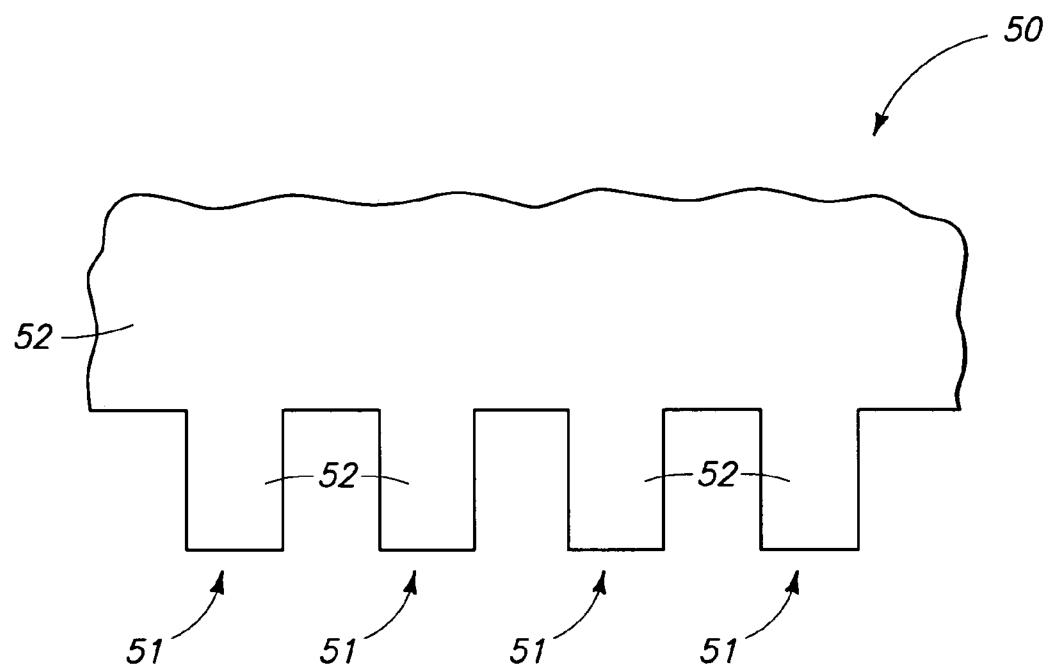
FIG. 16 is a view of the FIG. 12 and/or FIG. 15 substrate at a processing step subsequent to that shown by FIG. 12 and/or FIG. 15.

Alternately and less preferred, and by way of example only, FIG. 16 depicts alternate processing of substrate 50 whereby all of second material 54 has been removed from spaced features 51 prior to subsequent imprinting of one or more substrates.

Figure 17:
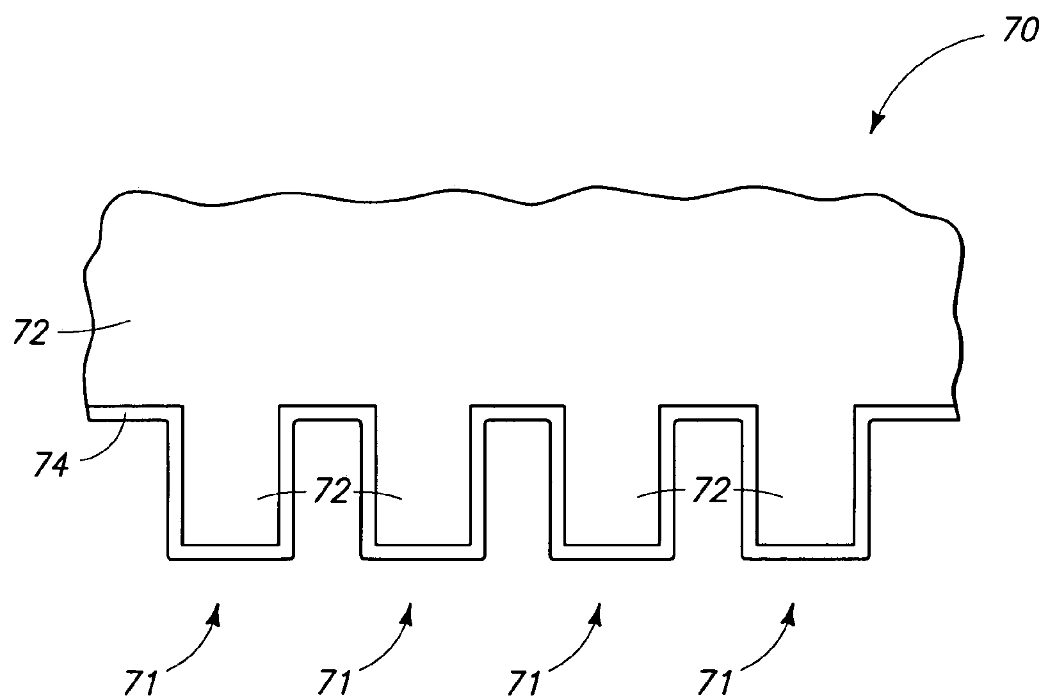
FIG. 17 is a diagrammatic representation of an imprint template in accordance with an aspect of the invention.

FIGS. 12-15 depict exemplary embodiments wherein or whereby second material 54/54*a*/54*b* is not also received laterally outwardly of first material 52/52*a*/52*b*. By way of example only, FIG. 17 depicts an alternate exemplary embodiment wherein the second material is received laterally outward of the first material. FIG. 17 depicts an imprint template 70 comprising spaced features 71 comprising a first material 72 and a second material 74 which is harder than first material 72. Exemplary and preferred materials are as described above. In the depicted exemplary FIG. 17 embodiment, second material 74 is shown as a layer which is received both laterally outward of first material 72 and elevationally outward of first material 72 relative to the plurality of spaced features 71. By way of example only, FIG. 17 also depicts one preferred embodiment where first material 72 and second material 74 are of different thicknesses within spaced features 71, with the FIG. 17 embodiment showing first material 72 being thicker than second material 74 within spaced feature 71. The alternate is contemplated, of course, wherein second material 74 is thicker than first material 72 within spaced features 71.

Figure 18:
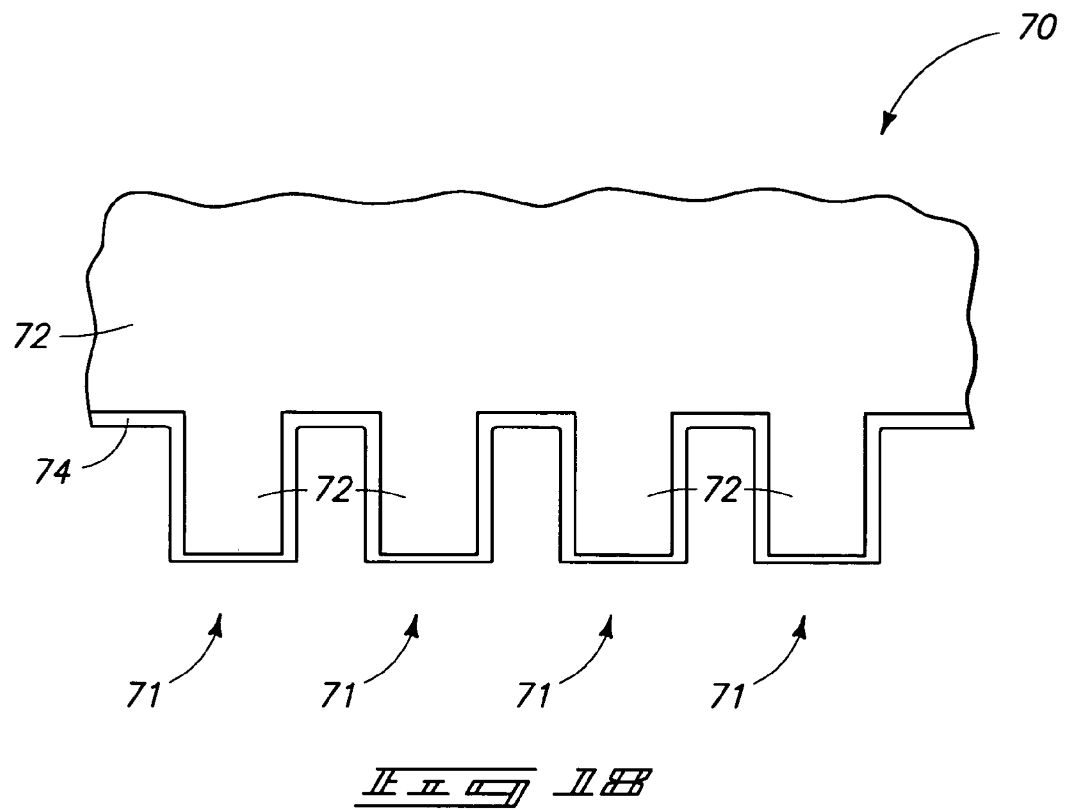
FIG. 18 is a diagrammatic representation of an imprint template in accordance with an aspect of the invention.

Referring to FIG. 18, imprint template 70 is depicted wherein an elevationally outermost portion of spaced features 71 has been removed effective to reduce the elevation of spaced features 71. FIG. 18 depicts such removing as not being effective to remove all of second material 74, and also whereby such removing does not expose any first material 72. Accordingly in the depicted FIG. 18 embodiment, in a method aspect of the invention, subsequent imprinting of another substrate with template 70 would bear only second material 74 against such substrate being imprinted. Anisotropic etching and polishings as described above are preferred techniques for producing the FIG. 18 construction.

Figure 19:
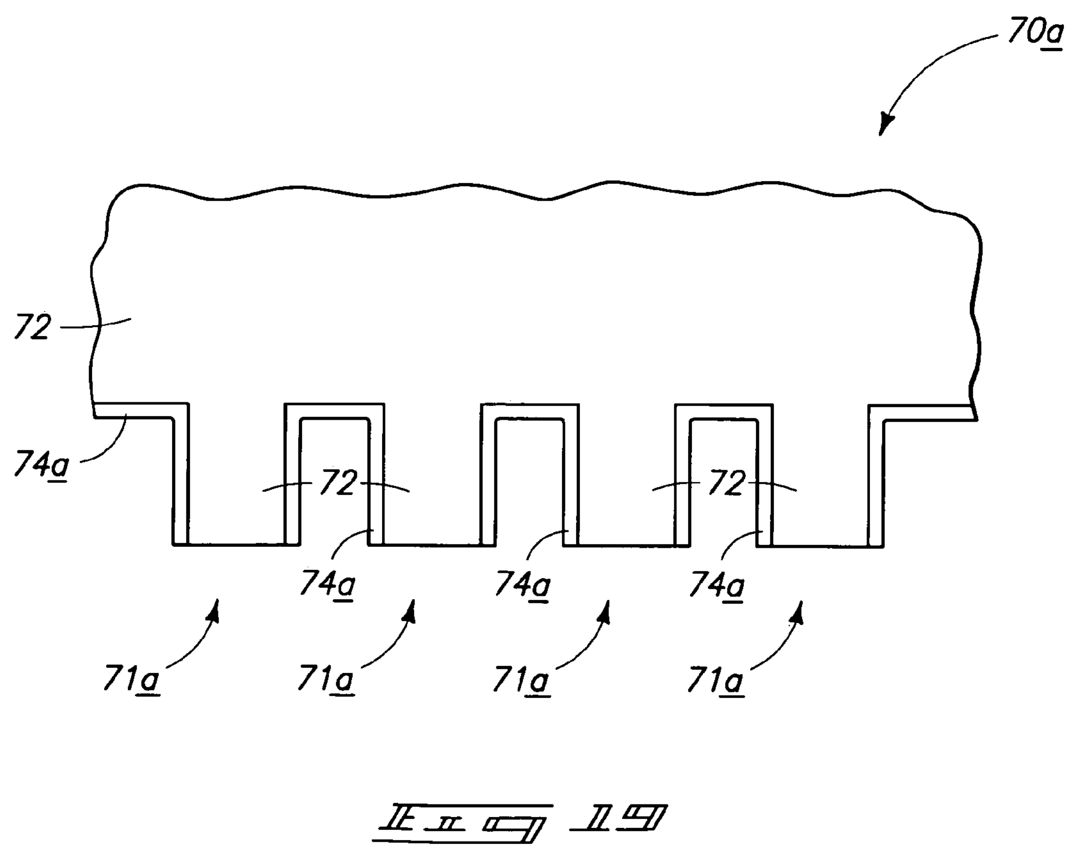
FIG. 19 is a diagrammatic representation of an imprint template in accordance with an aspect of the invention.

FIG. 19 depicts an exemplary alternate embodiment imprint substrate 70*a*. Like numerals have been utilized from the FIGS. 17 and 18 embodiment, with differences being indicated with the suffix "a". Imprint template 70*a* depicts exemplary initial fabrication, or removing in accordance with a methodical aspect of the invention, whereby not all of second material 74*a* is removed, thereby leaving exposed some first material 72 and some second material 74*a* of spaced features 71*a*. Accordingly, the imprinting of a substrate with the FIG. 19 depiction will press exposed first and second materials against such substrate being imprinted.

An aspect of the invention also contemplates processing whereby, for example, all of second material 74 is removed from the spaced features, followed by applying a layer onto the spaced features after such removal and prior to subsequent imprinting. Such layer might be the same as/more of the second material, or might be different from the second material, and might be harder or softer than the first material, or might be more of the first material. For example, and by way of example only, any of the FIGS. 17-19 substrates might be processed whereby second material 74/74*a* is completely removed, for example by isotropic etching, and then the depicted remaining projections of material 72 are coated with another layer of second material of the desired composition and thickness to provide a feature size for a subsequent imprinting with a hardened second material as part of the spaced features. For example where second material 74/74*a* comprises diamond or amorphous carbon, $O_2$ plasma ashing will etch the same selectively relative to underlying quartz.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of patterning a plurality of substrates, comprising:

providing an imprint template having a plurality of spaced features;

imprinting a first substrate with the imprint template effective to form a plurality of recesses into the first substrate from the spaced features;

after imprinting the first substrate, removing elevationally outermost portions of the spaced features by anisotropically etching through elevationally outermost surfaces of the spaced features without laterally etching into lateral side surfaces of the spaced features below the removed elevationally outermost portions effective to reduce elevation of the spaced features without reducing width of the spaced features; and after the removing, imprinting a second substrate with the imprint template using the elevation-reduced spaced features effective to form a plurality of recesses into the second substrate from the elevation-reduced spaced features.

2. The method of claim 1 wherein first substrate-imprinting is of a layer deposited upon the first substrate, the spaced features prior to the first substrate-imprinting comprising respective elevations which are at least 3 times the thickness of said layer.

3. The method of claim 2 wherein the spaced features prior to the first substrate-imprinting comprise respective elevations which are at least 5 times the thickness of said layer.

4. The method of claim 3 wherein the spaced features prior to the first substrate-imprinting comprise respective elevations which are at least 10 times the thickness of said layer.

5. The method of claim 1 wherein no substrate is imprinted with the imprint template intermediate the first substrate-imprinting and the second substrate-imprinting.

6. The method of claim 1 comprising imprinting another substrate with the imprint template intermediate the first substrate-imprinting and the second substrate-imprinting, and prior to said removing.

7. The method of claim 1 comprising after imprinting the second substrate, imprinting a third substrate with the imprint template.

8. The method of claim 7 comprising after imprinting the second substrate and before imprinting the third substrate, removing another elevationally outermost portion of the spaced features effective to further reduce elevation of the spaced features.

9. The method of claim 1 wherein the spaced features comprise different first and second materials at least prior to the first substrate-imprinting, the second material being received elevationally outward of the first material and being harder than the first material.

10. The method of claim 9 wherein the second material is also received laterally outward of the first material.

11. The method of claim 9 wherein the second material is not received laterally outward of the first material.

12. The method of claim 9 wherein the second material comprises diamond.

13. The method of claim 9 wherein the second material comprises a carbide.

14. The method of claim 9 wherein the second material comprises a nitride.

15. The method of claim 1 wherein the first and second substrates comprise semiconductor substrates, and the method of patterning comprises forming integrated circuits.

16. The method of claim 1 wherein the spaced features comprise projections from a substrate, the elevationally outermost portions being of a different material from an outer surface of the substrate from which such project.

17. A method of patterning a plurality of substrates, comprising:

providing an imprint template having a plurality of spaced features, the spaced features comprising different first and second materials, the second material being received elevationally outward of the first material and being harder than the first material;

imprinting a first substrate with the imprint template effective to form a plurality of recesses into the first substrate from the spaced features;

after imprinting the first substrate, removing an elevationally outermost portion of the second material effective to reduce elevation of the spaced features, the removing of the elevationally outermost portion of the second material exposing an elevationally outermost portion of the first material; and after the removing, imprinting a second substrate with the imprint template using the elevation-reduced spaced features effective to form a plurality of recesses into the second substrate from the elevation-reduced spaced features, the imprinting of the second substrate placing the exposed elevationally outermost portion of the first material into direct physical touching contact with the second substrate.

18. The method of claim 17 wherein the removing removes all of the second material from the spaced features.

19. The method of claim 17 wherein the removing does not remove all of the second material from the spaced features.

20. The method of claim 17 wherein the imprinting of the second substrate also places the second material into direct physical touching contact with the second substrate.

21. The method of claim 17 wherein the first material is thicker than the second material in the spaced features before the removing.

22. The method of claim 17 wherein the second material is thicker than the first material in the spaced features before the removing.

23. The method of claim 17 wherein the first and second materials are equal in thickness in the spaced features before the removing.

* * * * *